US010283332B2

(12) United States Patent
Umemoto et al.

(10) Patent No.: US 10,283,332 B2
(45) Date of Patent: May 7, 2019

(54) CU—GA BINARY ALLOY SPUTTERING TARGET AND METHOD OF PRODUCING THE SAME

(71) Applicant: MITSUBISHI MATERIALS CORPORATION, Tokyo (JP)

(72) Inventors: Keita Umemoto, Sanda (JP); Shoubin Zhang, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 1015 days.

(21) Appl. No.: 14/435,568

(22) PCT Filed: Oct. 16, 2013

(86) PCT No.: PCT/JP2013/078067
§ 371 (c)(1),
(2) Date: Apr. 14, 2015

(87) PCT Pub. No.: WO2014/061697
PCT Pub. Date: Apr. 24, 2014

(65) Prior Publication Data
US 2015/0332901 A1    Nov. 19, 2015

(30) Foreign Application Priority Data

Oct. 17, 2012  (JP) ................................ 2012-229469
Oct. 3, 2013  (JP) ................................ 2013-208191

(51) Int. Cl.
*H01J 37/34* (2006.01)
*C23C 14/34* (2006.01)
(Continued)

(52) U.S. Cl.
CPC ............ *H01J 37/3426* (2013.01); *B22F 3/10* (2013.01); *B22F 3/14* (2013.01); *B22F 3/15* (2013.01);
(Continued)

(58) Field of Classification Search
CPC ........................ H01J 37/3426; C23C 14/3414
See application file for complete search history.

(56) References Cited

U.S. PATENT DOCUMENTS 6,261,984 B1    7/2001   Mochizuki et al.
6,669,830 B1   12/2003   Inoue et al.
(Continued)

FOREIGN PATENT DOCUMENTS

CN    101906552      12/2010
CN    102395702 A     3/2012
(Continued)

OTHER PUBLICATIONS

Translation to Yano (JP 2012-017481 published Jan. 2012). (Year: 2012).*

(Continued)

*Primary Examiner* — John J Brayton
(74) *Attorney, Agent, or Firm* — Locke Lord LLP; James E. Armstrong, IV; Nicholas J. DiCeglie, Jr.

(57) ABSTRACT

A Cu—Ga binary alloy sputtering target having excellent mechanical workability, high density, and high bending strength, and a method of producing the sputtering target are provided. The sputtering target has a composition including 28 to 35 atomic % of Ga and the balance made of Cu and inevitable impurities. In addition, the sputtering target has a coexistence microstructure in which a low-Ga-containing Cu—Ga binary alloy phase is surrounded by a high-Ga-containing Cu—Ga binary alloy phase. The low-Ga-containing Cu—Ga binary alloy phase includes 26 atomic % or less of Ga and a balance made of Cu. The high-Ga-containing Cu—Ga binary alloy phase includes 28 atomic % or more of Ga.

6 Claims, 3 Drawing Sheets

(51) Int. Cl.
- C22C 9/00 (2006.01)
- C22C 1/04 (2006.01)
- B22F 3/10 (2006.01)
- B22F 3/14 (2006.01)
- B22F 3/15 (2006.01)
- B22F 3/24 (2006.01)
- C22C 28/00 (2006.01)

(52) U.S. Cl.
CPC .............. *B22F 3/24* (2013.01); *C22C 1/0425* (2013.01); *C22C 9/00* (2013.01); *C22C 28/00* (2013.01); *C23C 14/3414* (2013.01); *B22F 2003/247* (2013.01)

(56) References Cited

U.S. PATENT DOCUMENTS

| | | | |
|---|---|---|---|
| 7,935,558 B1 | 5/2011 | Juliano et al. | |
| 8,048,707 B1 | 11/2011 | Shufflebotham et al. | |
| 8,795,489 B2 * | 8/2014 | Zhang | C22C 1/0425 204/298.13 |
| 8,968,491 B2 | 3/2015 | Zhang et al. | |
| 2010/0116341 A1 | 5/2010 | Huang et al. | |
| 2011/0089030 A1 | 4/2011 | Juliano et al. | |
| 2012/0045360 A1 | 2/2012 | Matsumura et al. | |
| 2012/0090671 A1 | 4/2012 | Shufflebotham et al. | |
| 2012/0094429 A1 | 4/2012 | Juliano et al. | |
| 2012/0217157 A1 | 8/2012 | Zhang et al. | |
| 2012/0258562 A1 | 10/2012 | Hakuma et al. | |
| 2013/0001078 A1 | 1/2013 | Zhang et al. | |
| 2015/0014156 A1 | 1/2015 | Zhang et al. | |

FOREIGN PATENT DOCUMENTS

| | | | | |
|---|---|---|---|---|
| EP | 2420590 A1 | 2/2012 | | |
| JP | 3249408 B2 | 1/2002 | | |
| JP | 2007-266626 A | 10/2007 | | |
| JP | 2007-302909 A | 11/2007 | | |
| JP | 2008-138232 A | 6/2008 | | |
| JP | 2009-049389 A | 3/2009 | | |
| JP | 2010-265544 A | 11/2010 | | |
| JP | 2011-074418 A | 4/2011 | | |
| JP | 2011-117077 A | 6/2011 | | |
| JP | 2011-149039 A | 8/2011 | | |
| JP | 2011-149039 A | 8/2011 | | |
| JP | 2011-214140 A | 10/2011 | | |
| JP | 4811660 B2 | 11/2011 | | |
| JP | 2012017481 A * | 1/2012 | ........... | B22D 21/025 |
| JP | 2012-082498 A | 4/2012 | | |
| JP | 2012-193423 A | 10/2012 | | |
| JP | 2012-246574 A | 12/2012 | | |
| JP | 2013-199704 A | 10/2013 | | |
| JP | 2014-034703 A | 2/2014 | | |
| TW | 201109458 A | 3/2011 | | |
| TW | 201126003 A | 8/2011 | | |
| TW | 201127971 A | 8/2011 | | |
| TW | 201139702 A | 11/2011 | | |
| WO | 2009/142316 A1 | 11/2009 | | |
| WO | 2011/010529 A1 | 1/2011 | | |
| WO | 2011/055537 A1 | 5/2011 | | |
| WO | 2011/074685 A1 | 6/2011 | | |
| WO | 2011/083647 A1 | 7/2011 | | |
| WO | 2011/114657 A1 | 9/2011 | | |
| WO | WO-2012/005098 A1 | 1/2012 | | |
| WO | WO-2012005098 A1 * | 1/2012 | ........... | B22D 21/025 |
| WO | 2012/147985 A1 | 11/2012 | | |
| WO | 2013/077431 A1 | 5/2013 | | |

OTHER PUBLICATIONS

Translation to Sawada (JP 2011-149039 published Aug. 2011). (Year: 2011).*
A. Romeo et al., "*Development of Thin-film Cu(In,Ga)Se$_2$ and CdTe Solar Cells*", Prog. Photovolt: Res. Appl. 2004; 12, pp. 93-111.
International Search Report dated Dec. 10, 2013, issued for PCT/JP2013/078067 and English translation thereof.
Final Office Action dated Aug. 29, 2017, issued for U.S. Appl. No. 14/784,375.
Shogo Ishizuka et al., "Recent Developments in Chalcopyrite Solar Cell and Module Technologies," Journal of the Vacuum Society of Japan, vol. 53, No. 1, 2010, pp. 25-29 and partial translation/English abstract thereof.
Shogo Ishizuka, et al., "Na-induced variations in the structural, optical, and electrical properties of Cu(In,Ga)Se2 thin films," Journal of Applied Physics 106, 2009, pp. 034908-1 to 034908-6.
D. Rudmann et al., "Effects of NaF coevaporation on structural properties of Cu(In,Ga)Se2 thin films," Thin Solid Films, 431-432, 2003, pp. 37-40.
International Search Report dated Jul. 15, 2014, issued for PCT/JP2014/060405 and English translation thereof.
Office Action dated Dec. 1, 2016, issued for U.S. Appl. No. 14/784,375.
International Search Report of PCT/JP2013/054637 dated May 7, 2013.
Tanaka, Tooru et al; Characterization of Cu (InxGal-x)2Se3.5 thin films prepared by if sputtering; Solar Energy Materials and Solar Cells, 1998, vol. 50, pp. 13-18.
Tanaka Tooru et al; Preparaton of Cu(In,Ga)2Se3.5 thin films by radio frequency sputtering from stoichiometric Cu(In, Ga)Se2 and Na2Se mixture target; J. Appl. Phys. vol. 81, No. 11, 1997, pp. 7619-7622.
Notice of Refusal for Taiwan Patent Application No. 102106207 dated Feb. 13, 2015.
Supplementary European Search Report dated Oct. 12, 2015, issued for the European patent application No. 13752289.2.
Karin Granath, et al., "The effect of NaF on Cu (In,Ga)Se2 thin film solar cells," Solar Energy Materials & Solar Cells, vol. 60, 2000, pp. 279-293.
D. Rudmann, et al., "Sodium incorporation strategies for CIGS growth at different temperatures," Thin Solid Films, vol. 480-481, 2005, pp. 55-60.
International Search Report dated Nov. 19, 2013, issued for PCT/JP2013/071516 and English translation thereof.
Office Action dated Mar. 16, 2016, issued for the Japanese patent application No. 2012-178888 and English translation thereof.
Office Action dated Jun. 27, 2016, issued for the Taiwanese patent application No. 102128116 and English translation of Search Report.
Office Action dated Dec. 10, 2015, issued for U.S. Appl. No. 14/380,610.
Office Action dated Jun. 13, 2016, issued for U.S. Appl. No. 14/380,610.
Office Action dated Mar. 8, 2016, issued for the Chinese patent application No. 201380053585.7 and English translation thereof.
Office Action dated Mar. 5, 2018, issued for the Japanese patent application No. 2014-054655 and a machine English translation thereof.

* cited by examiner

CU—GA BINARY ALLOY SPUTTERING TARGET AND METHOD OF PRODUCING THE SAME

FIELD OF THE INVENTION

The present invention relates to a Cu—Ga binary alloy sputtering target, which is used for forming a film of Cu—In—Ga—Se quaternary alloy as a light-absorbing layer of a solar cell, for example, and a method of producing the Cu—Ga binary alloy sputtering target.

Priority is claimed on Japanese Patent Application No. 2012-229469, filed Oct. 17, 2012, and Japanese Patent Application No. 2013-208191, filed Oct. 3, 2013, the contents of which are incorporated herein by reference.

BACKGROUND OF THE INVENTION

The Cu—Ga sputtering target has been the essential material for producing a solar cell with the Cu—In—Ga—Se quaternary alloy film (CIGS film) as its light-absorbing layer by so-called "selenization method." The selenization method is a method of forming a film of CuInGaSe compound, for example, by heating a laminated film, in which CuGa is sputtered at about 500 nm and an In film is sputtered on the sputtered CuGa at the thickness of about 500 nm, in $H_2Se$ gas at 500° C. to diffuse Se in CuGaIn (for example, refer Patent Literature 1 (PTL 1)).

Conventionally, in the CuGa sputtering target with high density and high Ga content used for formation of the light-absorbing layer, particularly in the case where Ga content exceeds 28 atomic %, the highly-densified sputtering target becomes very hard and inductile since the deposition ratio of the brittle γ phase with poor workability is increased. Particularly, in the case where it is a casting by melting and casting, cutting work is difficult since cracking or fracturing occur during surface machining by cutting. Thus, machining has to be done by grinding work. Because of this, machining speed of the target is slow, and machining of the target with a complex shape is very difficult.

Under the circumstances described above, a sputtering target with a high-Ga-containing Cu—Ga binary alloy having a two-phase coexistence microstructure, in which a high-Ga-containing Cu—Ga binary alloy grain (high-Ga phase) is surrounded by a grain boundary phase made of a low-Ga containing Cu—Ga binary alloy (low-Ga phase), is proposed (for example, refer Patent Literature 2 (PTL 2)). The sputtering target has a composition containing 30 to 60 mass % of Ga and a balance made of Cu. The high-Ga-containing Cu—Ga binary alloy grain contains 30 mass % or more of Ga and a balance made of Cu. The low-Ga containing Cu—Ga binary alloy contains 15 mass % or less of Ga.

In the above-explained high-Ga-containing Cu—Ga binary alloy sputtering target, cracking or fracturing during cutting are prevented by having the above-explained two-phase coexistence microstructure in which the brittle γ phase is surrounded by the low-Ga phase with excellent malleability. As a result, good yield is obtained.

On the other hand, in order to improve efficiency of electric power generation of the light-absorbing layer made of Cu—In—Ga—Se quaternary alloy film, sodium (Na) addition to the light-absorbing layer is proposed (for example, refer PTL 2 and Non Patent Literature 1 (NPL 1)). In this proposal, it is disclosed that the Na content in the precursor film (Cu—In—Ga—Se quaternary alloy film) is generally set to about 0.1%.

RELATED ART DOCUMENTS

Patent Literature

PTL 1: Japanese Patent (Granted) Publication No. 3249408 (B)
PTL 2: Japanese Unexamined Patent Application, First Publication No. 2008-138232 (A)

Non Patent Literature

NPL 1: A. Romeo, "Development of Thin-film Cu(In,Ga)$Se_2$ and CdTe Solar Cells", Prog. Photovolt: Res. Appl. 2004; 12:93-111 (DOI: 10.1002/pip.527)

Problems to be Solved by the Present Invention

The above-described related arts, there are problems to be solved explained below.

In the sputtering target described in PTL 2, cracking or fracturing are unlikely to occur even if it is subjected to surface machining by cutting. However, sintering is not proceeded sufficiently in many cases because Ga is not diffused from the high-Ga phase to the low-Ga phase (or Cu from the low-Ga phase to the high-Ga phase) sufficiently due to the large Ga content difference between the high-Ga phase and the low-Ga phase. Therefore, there is a problem that the sintered material becomes relatively low density and the bending strength becomes low. In addition, it is found that the effect of preventing the occurrence of cracking or fracturing is reduced when the Ga content of the low-Ga-containing Cu—Ga binary alloy grain is further increased above the level defined in the range described above to obtain even higher densification.

The present invention is made under the circumstances described above. The purpose of the present invention is to provide a Cu—Ga binary alloy sputtering target containing 28 atomic % or more of Ga, which has excellent mechanical workability; high density; and high bending strength, and a method of producing the sputtering target.

SUMMARY OF THE INVENTION

Means to Solving the Problems

The inventors of the present invention conducted extensive studies in order to produce a Cu—Ga binary alloy sputtering target, which is not turned into a defective product due to occurrence of cracking or fracturing during cutting for surface machining and has a high bending strength. As a result, they found that excellent mechanical workability and high bending strength can be satisfied at the same time by configuring the sputtering target to have a coexistence microstructure of specific low-Ga-containing Cu—Ga binary alloy phase and high-Ga-containing Cu—Ga binary alloy phase, both of which are different from those of the sputtering target described in PTL 2.

The present invention is made based on the above-explained finding and has aspects described below to solve the problems.

The first aspect of the present invention is a Cu—Ga binary alloy sputtering target with a composition including 28 to 35 atomic % of Ga and the Cu balance and inevitable impurities, wherein the sputtering target has a coexistence microstructure in which a low-Ga-containing Cu—Ga binary alloy phase is surrounded by a high-Ga-containing Cu—Ga binary alloy phase, the low-Ga-containing Cu—Ga binary alloy phase includes 26 atomic % or less of Ga and a Cu balance, and the high-Ga-containing Cu—Ga binary alloy phase includes 28 atomic % or more of Ga.

The Cu—Ga binary alloy sputtering target related to the present invention has the composition including 28 to 35 atomic % of Ga and the Cu balance and inevitable impurities. In addition, the Cu—Ga binary alloy sputtering target related to the present invention has the coexistence microstructure in which the low-Ga-containing Cu—Ga binary alloy phase, which includes 26 atomic % or less of Ga and a Cu balance (hereinafter referred as "low-Ga alloy phase"), is surrounded by the high-Ga-containing Cu—Ga binary alloy phase, which includes 28 atomic % or more of Ga (hereinafter referred as "high-Ga alloy phase"). As a result, cracking or fracturing does not occur during cutting. In addition, the Cu—Ga binary alloy sputtering target is highly densified and has high bending strength.

The reason for setting the Ga content to 28 to 35 atomic % to the whole Cu—Ga binary alloy sputtering target is as explained below. If it exceeded 35 atomic %, the Cu—Ga binary alloy phase in the sputtering target would become a single phase. In this case, the coexistence microstructure of the low-Ga alloy phase and the high-Ga alloy phase cannot be obtained, or the Ga content in the low-Ga alloy phase becomes 26 atomic % or more even if the coexistence microstructure can be obtained. In the latter case, although the low-Ga alloy phase is surrounded by the high-Ga alloy phase, both phases are turned into alloy phases with poor workability. Therefore, cracking occurs during cutting work and bending strength is reduced. The reason for setting the Ga content in the low-Ga alloy phase to 26 atomic % or less is that if it exceeded 26 atomic %, the low-Ga-containing Cu—Ga binary alloy phase would be $\gamma$ phase with poor workability, making it easy for cracking to occur during cutting.

The reason for setting the Ga content in the high-Ga alloy phase to 28 atomic % or more is that if it were 28 atomic % or less, the composition including 28 atomic % or more of the Ga content as a whole Cu—Ga binary alloy sputtering target cannot be obtained.

In addition, in the Cu—Ga binary alloy sputtering target related to the present invention, sodium (Na) is included in the Cu—Ga binary alloy sputtering target used for depositing the light-absorbing layer to improve the efficiency of electric power generation of the light-absorbing layer made of Cu—In—Ga—Se quaternary alloy film by adding Na to the light-absorbing layer.

Specifically, in the Cu—Ga binary alloy sputtering target, the Cu—Ga binary alloy may have a composition including: 28 to 35 atomic % of Ga; 0.05 to 15 atomic % of Na; and the Cu balance and inevitable impurities, as metal element composition.

Moreover, in the Cu—Ga binary alloy sputtering target, the Na may be included as a form of at least a Na-compound selected from a group consisting of sodium fluoride (NaF), sodium sulfide (NaS), and sodium selenide ($Na_2Se$). In addition, in the Cu—Ga binary alloy sputtering target, the Cu—Ga binary alloy sputtering target may have a structure in which the Na-compound is dispersed in the matrix of the Cu—Ga binary alloy sputtering target; and the average grain size of the Na-compound may be 10 µm or less.

The method of calculating the contents of the metal elements in the Cu—Ga binary alloy sputtering target is explained below.

The Na content and the Ga content are relative to the total metal elements in the sputtering target, and can be calculated as the ratios relative to the sum of Cu, Ga, and Na in the target as shown below.

Na/(Na+Cu+Ga)×100%  Na (atomic %):

Ga/(Na+Cu+Ga)×100%  Ga (atomic %):

In the Cu—Ga binary alloy sputtering target, which is an aspect of the present invention, 0.05 to 15 atomic % of Na is included. The reason for this limitation related to the Na content is that if it were less than 0.05 atomic %, the effect of improving the conversion efficiency in the solar cell could not be obtained after formation of CIGS film. If it exceeded 15 atomic %, target cracking originated from the Na compound would occur. Furthermore, if the average grain size of the Na compound were 10 µm or less, occurrence of unusual discharge during sputtering can be reduced.

Other aspect of the present invention is a method of producing the Cu—Ga binary alloy sputtering target of the first aspect of the present invention, the method including the steps of preparing a mixed powder by: blending a pure copper powder or a low-Ga-containing Cu—Ga binary alloy powder, which includes 26 atomic % or less of Ga and a balance made of Cu with a high-Ga-containing Cu—Ga binary alloy powder, which includes Ga at higher than 28 atomic % and 75 atomic % or less and a balance made of Cu in such a way that a composition after blending includes 28 to 35 atomic % of Ga and a balance made of Cu; and mixing the powders after blending; sintering the mixed powder by hot-pressing, hot isostatic pressing sintering, or pressureless sintering under a non-oxidizing atmosphere or a reducing atmosphere; and cutting a surface of a sintered material which is obtained in the step of sintering and has a composition including 28 to 35 atomic % of Ga and a balance made of Cu, wherein the high-Ga-containing Cu—Ga binary alloy powder is blended in the mixed powder at 15% or more and 85% or less, an average grain size of the high-Ga-containing Cu—Ga binary alloy powder is 250 µm or less and an average grain size of the pure copper powder or the low-Ga-containing Cu—Ga binary alloy powder is 125 µm or less, the average grain size of the high-Ga-containing Cu—Ga binary alloy powder is higher than the average grain size of the pure copper powder or the low-Ga-containing Cu—Ga binary alloy powder, and a holding temperature during the step of sintering is set to a temperature between a temperature 200° C. lower than a melting point of the mixed powder and a temperature 50° C. lower than the melting point of the mixed powder. The melting point of the mixed powder is the melting point of the total composition obtained by mixing the high-Ga-containing Cu—Ga binary alloy powder and the low-Ga-containing Cu—Ga binary alloy powder or the pure copper powder.

According to the method of producing the Cu—Ga binary alloy sputtering target related to the present invention, a highly densified sputtering target having the coexistence microstructure in which the low-Ga-containing Cu—Ga binary alloy phase, which includes 26 atomic % or less of Ga and a balance made of Cu, is surrounded by the high-Ga-containing Cu—Ga binary alloy phase, which includes Ga at higher than 28 atomic %, can be produced. Having the coexistence microstructure in this specification means that structure is in the state where the low-Ga-containing Cu—Ga binary alloy phase, which includes 26 atomic % or less of Ga and the Cu balance and inevitable impurities, is surrounded by the high-Ga-containing Cu—Ga binary alloy phase, which includes Ga at higher than 28 atomic %; and the low-Ga-containing Cu—Ga binary alloy phases are dispersed in the matrix of the high-Ga-containing Cu—Ga binary alloy phase.

If the blending amount of the high-Ga-containing Cu—Ga binary alloy powder were less than 15% or exceeded 85%, the Cu—Ga binary alloy would become a single phase, deteriorating workability and bending strength.

The reason for setting the holding temperature in the above-described range during sintering by hot-pressing, hot isostatic pressing sintering, or pressureless sintering under a non-oxidizing atmosphere or a reducing atmosphere is that if the holding temperature were set lower than 200° C. from the melting point of the mixed powder, sufficient density could not be obtained. If the holding temperature were set higher than 50° C. from the melting point of the mixed powder, the mixed powder could be melted during temperature elevation.

The reason for setting the Ga content of the high-Ga-containing Cu—Ga binary alloy powder to 75 atomic % or less is that if the Ga content exceeded 75 atomic %, Ga could be melted out from the powder during pressurized-temperature elevation.

In the method of producing the Cu—Ga binary alloy sputtering target related to the present invention, the high-Ga-containing Cu—Ga binary alloy powder may include 45 atomic % of Ga or higher.

In the method of producing the Cu—Ga binary alloy sputtering target, the amounts of the metallic components can be adjusted easily by setting the Ga content of the high-Ga-containing Cu—Ga binary alloy powder to 45 atomic % or more.

Effects of the Invention

According to the present invention, the technical effects described below can be obtained.

According to the Cu—Ga binary alloy sputtering target and the method of producing the target related to the present invention, cracking or fracturing does not occur during cutting and the target has high density and high bending strength, since the target has the coexistence microstructure, in which the low-Ga-containing Cu—Ga binary alloy phase is surrounded by the high-Ga-containing Cu—Ga binary alloy phase. Therefore, surface machining can be performed easily by cutting; the machining speed of the sputtering target is fast; and the target with a complex shape can be machined easily, in the sputtering target related to the present invention. In addition, the target is resistant to thermal shock during sputtering since it has high density and high bending strength. Thus, cracking of the target or the like can be suppressed.

In addition, sodium (Na) can be added to the light-absorbing layer to improve the efficiency of electric power generation of the layer by utilizing this Cu—Ga binary alloy sputtering target for sputtering film deposition during formation of the light-absorbing layer made of the Cu—In—Ga—Se quaternary alloy film of a solar cell in the case where the Cu—Ga binary alloy sputtering target related to the present invention includes Na component.

DETAILED DESCRIPTION OF THE INVENTION

The Cu—Ga binary alloy sputtering target and the method of producing the sputtering target related to the present invention are explained by using the first and second embodiments below. In the first embodiment, the sputtering target has the coexistence microstructure in which the low-Ga-containing Cu—Ga binary alloy phase is surrounded by the high-Ga-containing Cu—Ga binary alloy phase. In the second embodiment, Na or Na compound is included in the Cu—Ga binary alloy sputtering target with the above-mentioned coexistence microstructure.

First Embodiment

The Cu—Ga binary alloy sputtering target of the first embodiment has a composition including 28 to 35 atomic % of Ga and the Cu balance and inevitable impurities. In addition, the sputtering target has a coexistence microstructure in which the low-Ga-containing Cu—Ga binary alloy phase, which includes 26 atomic % or less of Ga and the Cu balance and inevitable impurities, is surrounded by the high-Ga-containing Cu—Ga binary alloy phase, which includes 28 atomic % or more of Ga.

A preferable lower limit of the Ga content in the low-Ga-containing binary alloy phase is 15 atomic %. A preferable upper limit of the Ga content in the high-Ga-containing Cu—Ga binary alloy phase is 40 atomic %.

Figure 1:
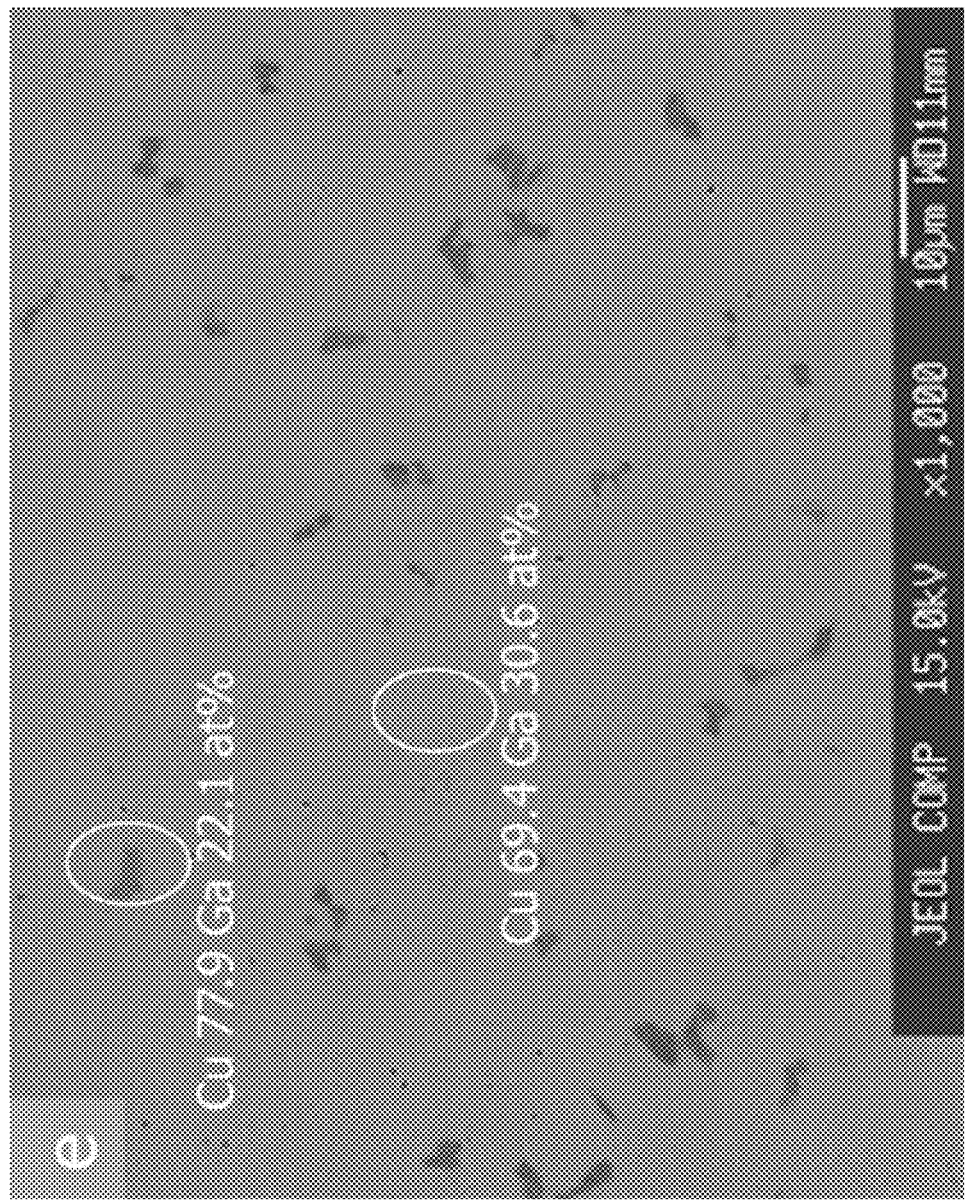
FIG. 1 is a photographic image showing a composition image (COMPO image) of a specific example of the Cu—Ga binary alloy sputtering target related to the present invention obtained by an electron probe micro analyzer (EPMA).
Figure 2:
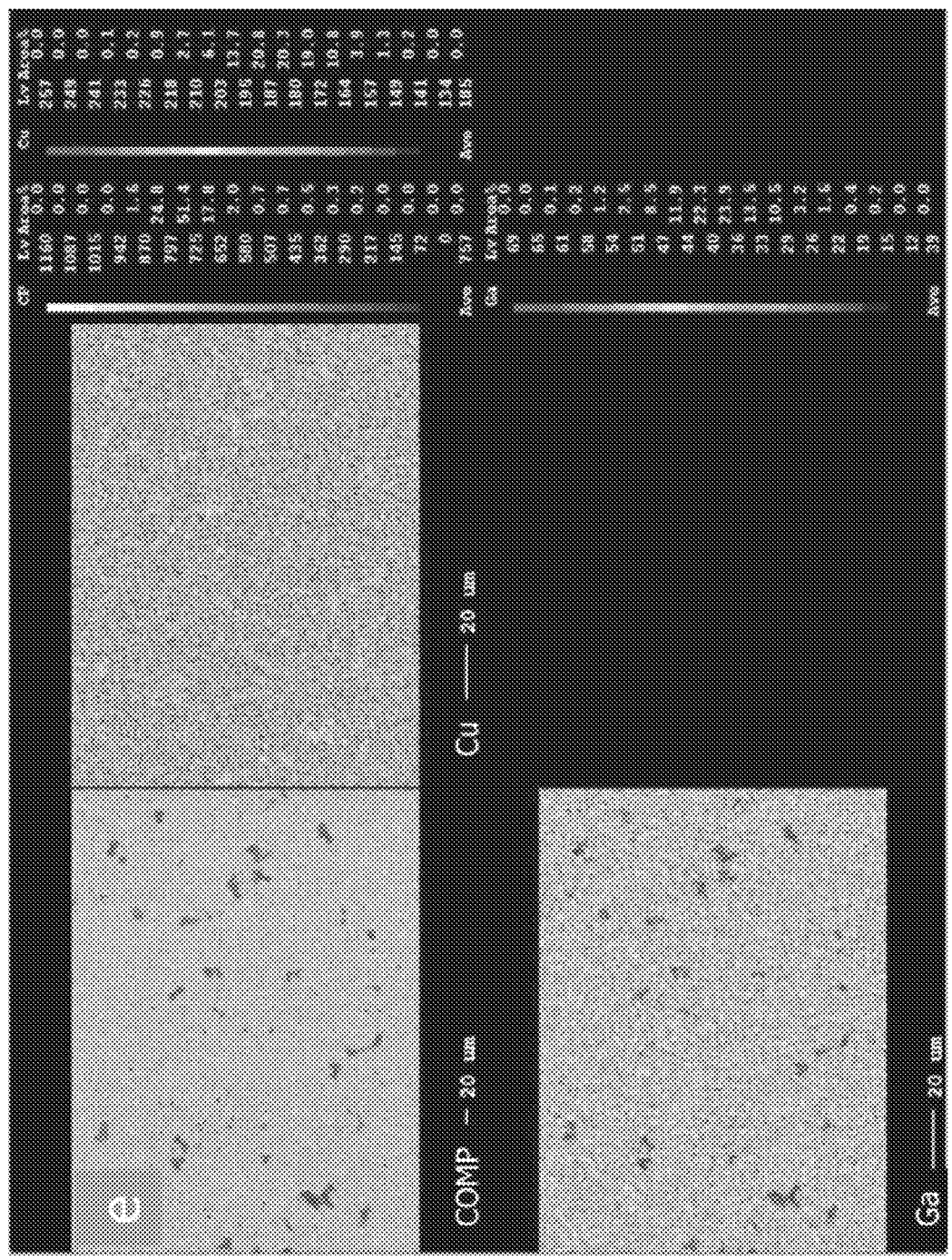
FIG. 2 is a photographic image showing a composition image (COMPO image); Cu element mapping image; and Ga element mapping image, of a specific example of the Cu—Ga binary alloy sputtering target related to the present invention obtained by an electron probe micro analyzer (EPMA).

The coexistence microstructure can be observed by element mapping images of Cu and Ga obtained by the electron microprobe (EPMA) as shown in FIGS. 1 and 2, for example.

In the Cu—Ga binary alloy sputtering targets of the specific examples of the present invention shown in FIGS. 1 and 2, density is 90% or more and bending strength is 200 MPa or more. The above-described density is the converted value regarding the density of the casting as 100%.

The bending strength (rupture strength) is obtained by: preparing a test piece of 3×3×35 mm as the Cu—Ga binary alloy sputtering target; measuring the stress trajectory at 0.5 mm/min of indentation speed by using the autograph manufactured by Shimadzu Corporation, model AG-X, as a measurement apparatus; and measuring the maximum point stress in the elastic area.

The method of producing the Cu—Ga binary alloy sputtering target of the present embodiment includes the steps of: preparing a mixed powder by: blending a pure copper powder or a low-Ga-containing Cu—Ga binary alloy powder, which includes 26 atomic % or less of Ga and a balance made of Cu with a high-Ga-containing Cu—Ga binary alloy powder, which includes Ga at higher than 28 atomic % and 75 atomic % or less and a balance made of Cu in such a way that a composition after blending includes 28 to 35 atomic % of Ga and a balance made of Cu; and mixing the powders after blending; sintering the mixed powder by hot-pressing, hot isostatic pressing sintering, or pressureless sintering under a non-oxidizing atmosphere or a reducing atmosphere; and cutting a surface of a sintered material which is obtained in the step of sintering and has a composition including 28 to 35 atomic % of Ga and a balance made of Cu. A preferable lower limit of the Ga content of the low-Ga-containing Cu—Ga binary alloy powder is 5 atomic %.

The holding temperature during the step of sintering the mixed powder by hot-pressing, hot isostatic pressing sintering, or pressureless sintering under a non-oxidizing atmosphere or a reducing atmosphere is set to a temperature between a temperature 200° C. lower than a melting point of the mixed powder and a temperature 50° C. lower than the melting point of the mixed powder. The melting point of the mixed powder is the melting point of the total composition obtained by mixing the high-Ga-containing Cu—Ga binary alloy powder and the low-Ga-containing Cu—Ga binary alloy powder or the pure copper powder. The measurement condition of the above-described melting point is 10° C./min of temperature elevation rate in a nitrogen atmosphere.

In regard of the mixing ratio of the high-Ga-containing Cu—Ga binary alloy powder to the pure copper powder or the low-Ga-containing Cu—Ga binary alloy powder, the high-Ga-containing Cu—Ga binary alloy powder corresponds to 15% or more and 85% or less in the mixed powder. The average grain size of the high-Ga-containing raw material powder is 250 µm or less and the average grain size of the pure copper powder or the low-Ga-containing raw material powder is 125 µm or less. A preferable lower limit of the average grain size of the high-Ga-containing raw material powder is 5 µm. A preferable lower limit of the average grain size of the low-Ga-containing raw material powder is 5 µm. In addition, the average grain size of the high-Ga-containing raw grain powder is set larger than the average grain size of the low-Ga-containing raw grain powder.

It is preferable that the high-Ga-containing Cu—Ga binary alloy powder includes 45 atomic % of Ga or higher.

In the method of measuring the average grain size, the average grain size is obtained by: preparing a solution of 0.2% of sodium hexametaphosphate; adding an appropriate amount of an alloy powder; and measuring grain size distribution of the alloy powder by using the measuring apparatus, model Microtrac MT3000, manufactured by Nikkiso Corporation.

In regard to the raw material powder added and mixed with the high-Ga-containing Cu—Ga binary alloy powder, the pure Cu powder is more preferable than the low-Ga-containing Cu—Ga binary alloy powder. In addition, the high-Ga-containing Cu—Ga binary alloy powder and the low-Ga-containing Cu—Ga binary alloy powder do not have to be a powder with a single component. Each of them may be a powder with multiple components.

As explained above, the Cu—Ga binary alloy sputtering target of the present embodiment has the composition including 28 to 35 atomic % of Ga and the Cu balance and inevitable impurities, wherein the sputtering target has the coexistence microstructure in which the low-Ga-containing Cu—Ga binary alloy phase (hereinafter referred as the low-Ga alloy phase, occasionally) is surrounded by the high-Ga-containing Cu—Ga binary alloy phase (hereinafter referred as the high-Ga alloy phase, occasionally), the low-Ga-containing Cu—Ga binary alloy phase includes 26 atomic % or less of Ga and a the Cu balance and inevitable impurities, and the high-Ga-containing Cu—Ga binary alloy phase includes 28 atomic % or more of Ga. As a result, cracking or fracturing does not occur during cutting. In addition, the Cu—Ga binary alloy sputtering target is highly densified and has high bending strength.

In addition, in the method of producing a Cu—Ga binary alloy sputtering target of the present embodiment, the high-Ga-containing Cu—Ga binary alloy powder is blended in the mixed powder at 15% or more and 85% or less, the holding temperature during the step of sintering the mixed powder by hot-pressing, hot isostatic pressing sintering, or pressureless sintering under a non-oxidizing atmosphere or a reducing atmosphere is set to a temperature between a temperature 200° C. lower than a melting point of the mixed powder and a temperature 50° C. lower than the melting point of the mixed powder, the average grain size of the high-Ga-containing raw material powder is 250 µm or less and the average grain size of the pure copper powder or the low-Ga-containing raw material powder is 125 µm or less, and the average grain size of the high-Ga-containing raw material powder is higher than the average grain size of the pure copper powder or the low-Ga-containing raw material powder. As a result, the high density sputtering target with the coexistence microstructure, in which the low-Ga-containing Cu—Ga binary alloy phase, which includes 26 atomic % or less of Ga and a Cu balance, is surround by the high-Ga-containing Cu—Ga binary alloy phase, which includes 28 atomic % or more of Ga, can be produced.

Example (Ex.)

Next, the examples of the Cu—Ga binary alloy sputtering target of the first embodiment of the present invention were produced in accordance with the above-described production method. Evaluation results of the examples are explained below.

[Preparation of Raw Material Powder]

First, as raw material powders used for examples of the present invention, the high-Ga-containing Cu—Ga binary alloy powder and low-Ga-containing Cu—Ga binary alloy powder having the compositions and the average grain sizes shown in Table 1 below were prepared. These alloy powders were prepared by gas atomizing method using Ar gas with an adjusted Ga content after weighting 4N (purity: 99.99%) Cu solid metal blank and 4N (purity: 99.99%) Ga solid metal blank to obtain a predetermined composition ratio; and filling the carbon crucible by materials to melt them. The Ga contents are shown in the column of "Ga amount (atomic %)" in the "Raw material powder" column in Table 1.

Next, the mixed powders (Examples 1-14) were prepared by mixing the above-prepared high-Ga-containing Cu—Ga binary alloy powder and the above-prepared high-Ga-containing Cu—Ga binary alloy powder or pure Cu powder in the blending ratios shown in the column of "Blending ratio of high-Ga powder and low-Ga powder (%)" in Table 1. In the case where the pure Cu powder was used instead of the low-Ga-containing Cu—Ga binary alloy powder, the ratio of pure Cu powder is shown in the column. For mixing these powders, the Henschel mixer was used, and mixing was performed under Ar atmosphere at the revolution speed of 2800 rpm for 1 minute.

[Production of the Sputtering Target and Evaluation]

By using the mixed powders of Examples 1-14 prepared as described above, sintering by vacuum hot-pressing method; pressureless sintering; or hot isostatic pressing sintering, was performed in accordance with the conditions shown in the column "Sintering condition" in Table 1. The surface parts and the outer peripheral parts of the obtained sputtering targets were subjected to lathing to produce the Cu—Ga binary alloy sputtering targets of Examples 1-14 with 50 mm of diameter and 6 mm of thickness. In production of the Cu—Ga binary alloy sputtering targets of Examples 4, 6, 8-11, and 14, pure copper powder was used instead of the low-Ga-containing Cu—Ga binary alloy powder. Thus, "0" is shown in "Ga (atomic %)" column of "Low-Ga-containing Cu—Ga powder" in Table 1.

In regard to the Cu—Ga binary alloy sputtering targets of Examples 1-14, the Ga content (atomic %) to the whole target, the Ga content (atomic %) in the high-Ga-containing Cu—Ga binary alloy powder, and the Ga content (atomic %) in the low-Ga-containing Cu—Ga binary alloy powder, are shown in the column "Composition of metal element (atomic %)" in Table 2, in the column "High-Ga phase" in Table 2, and in the column "Low-Ga phase" in Table 2, respectively.

Calculated results of density of the Cu—Ga binary alloy sputtering targets of Examples 1-14, are shown in the column "Density" in Table 2. As the density, dimensional density (g/cm$^3$) was calculated by using volume calculated from the dimension of the sintered material and weight. Also, relative density (%) was calculated by regarding the density of casting as 100%

The relative density of Cu—Ga alloy was calculated by regarding the density of casting of the Cu—Ga alloy as the true density. Specifically, for example, in the case where the Ga of the Cu—Ga alloy composition is 28 atomic % or more and 33 atomic % or less, the density 8.55 g/cm$^3$ obtained in the casting of 30 atomic % of Ga (Comparative Example 20) was regarded as the true density. In the case where the Ga of the Cu—Ga alloy composition is higher than 33 atomic % and 35 atomic % or less, the density 8.43 g/cm$^3$ obtained in the casting of 35 atomic % of Ga (Comparative Example 21) was regarded as the true density. The relative density was calculated by dividing the density obtained from sintering the powder by the above-described true density.

In addition, in Example of the present invention, the holding temperature during the step of sintering the mixed powder by hot-pressing, hot isostatic pressing sintering, or pressureless sintering under a non-oxidizing atmosphere or a reducing atmosphere was set to a temperature between a temperature 200° C. lower than the melting point of the mixed powder and a temperature 50° C. lower than the melting point of the mixed powder. When the Ga content relative to the whole mixed powder is 30 atomic %, the melting point is 830° C. Thus, the holding temperature during sintering was set to the range between 630-780° C. Also, when the Ga content relative to the whole mixed powder is 35 atomic %, the melting point is 800° C. Thus, the holding temperature during sintering was set to the range between 600-750° C. The melting point of the Cu—Ga alloy was set to 830° C., 800° C., 760° C., and 256° C. in the case where Ga of the Cu—Ga alloy composition was: 28 atomic % or more and 30 atomic % or less; higher than 30 atomic % and 35 atomic % or less; higher than 35 atomic % and 40 atomic % or less; and higher than 40 atomic % and 80 atomic % or less, respectively. The melting point of the mixed powder is the melting point of the total Ga composition obtained by mixing the high-Ga-containing Cu—Ga binary alloy powder and the low-Ga-containing Cu—Ga binary alloy powder or the pure copper powder. The measurement condition of the above-described melting point was 10° C./min of temperature elevation rate in a nitrogen atmosphere.

In addition, structure observation of the Cu—Ga binary alloy sputtering target was performed by EPMA and results are shown in the column "Structure" in Table 2. In this column "Structure", the two-phase coexistence microstructure in which the low-Ga phase was surrounded by the high-Ga phase; the two-phase coexistence microstructure in which the high-Ga phase was surrounded by the low-Ga phase contrary to the case described above; the single-phase structure; and the cast structure, are shown as "A"; "B"; "C"; and "D", respectively. In addition, cutting work on the surface of the target was performed, and results monitoring existence or non-existence of cracking or fracturing during the cutting work were shown in the column "Existence or non-existence of cracking in cutting" in Table 2. In the case where there was no cracking or fracturing, "Non-existent" is shown. In the case where there was cracking or fracturing, "Existent" is shown. In addition, results obtained by measuring bending strength are shown in the column "Bending strength (MPa)" in Table 2. In the bending strength (rupture strength) measurement, the test piece of 3×3×35 mm was prepared; the stress trajectory at 0.5 mm/min of indentation speed was measured by using the autograph manufactured by Shimadzu Corporation, model AG-X, as a measurement apparatus; and the maximum point stress in the elastic area was measured, to obtain the bending strength.

Comparative Example (C. Ex.)

In Comparative Examples, the Ga content or the average grain size of the high-Ga-containing binary alloy phase or the low-Ga-containing binary alloy phase was set to be out of the ranges configured in the present invention as shown in Table 1.

Comparative Examples 1-4; Comparative Examples 5-7, in which the blending ratio of the raw material powder was set to be out of the range configured in the present invention; Comparative Examples 8-11, 15, and 16, in which hot-pressing temperature was set to be out of the range configured in the present invention; Comparative Examples 12-14, in which the Ga content relative to the whole target composition was set to be out of the range configured in the present invention; Comparative Examples 17-19, in which hot isostatic pressing sintering, or pressureless sintering was performed in a condition configured differently from the condition in the present invention; and Comparative Examples 20 and 21 produced by casting, were produced. Then, evaluation was performed as in the above-described Example of the present invention. In producing of the Cu—Ga binary alloy sputtering targets of Comparative Examples 2, 5, 7, 8, 12, 14, 15, 17, and 19, pure copper powder was used instead of the low-Ga-containing Cu—Ga binary alloy powder. Thus, "0" is shown in "Ga (atomic %)" column of "Low-Ga-containing Cu—Ga powder" in Table 1. Also, the pressureless sintering in Comparative Example 17 was performed in atmospheric air.

The evaluation results of the Cu—Ga binary alloy sputtering targets of Comparative Examples 1-21 are shown in Table 2. In Comparative Examples 20 and 21, Cu—Ga binary melts which had the compositions shown in Table 1 were prepared. Then, ingots were produced by casting the obtained Cu—Ga binary melts into the molds. The surfaces of the ingots were subjected to cutting to finish the sputtering targets. In Comparative Examples 1, 2, 8 and 10, the samples were molted during temperature elevation. Thus, the above-explained evaluation was not performed.

TABLE 1

| | Raw material powder | | | | Blending ratio of high and low Ga powders (%) | | Sintering condition | | |
|---|---|---|---|---|---|---|---|---|---|
| | High-Ga-containing Cu—Ga powder | | Low-Ga-containing Cu—Ga powder | | | | | | |
| | Ga content (atomic %) | Average grain size (μm) | Ga content (atomic %) | Average grain size (μm) | High-Ga containing Cu—Ga powder | Low-Ga containing Cu—Ga powder | Sintering method | Temp. (° C.), 1 h | Pressure (MPa) |
| Ex. 1 | 30 | 111 | 25 | 43 | 80.0 | 20.0 | Hot-pressing | 770 | 15 |
| Ex. 2 | 40 | 33 | 5 | 25 | 71.4 | 28.6 | | 700 | 17.5 |
| Ex. 3 | 40 | 172 | 10 | 120 | 83.3 | 16.7 | | 600 | 17.5 |
| Ex. 4 | 50 | 21 | 0 | 20 | 60.0 | 40.0 | | 740 | 20 |
| Ex. 5 | 50 | 122 | 20 | 82 | 43.3 | 56.7 | | 650 | 20 |
| Ex. 6 | 60 | 87 | 0 | 20 | 53.3 | 46.7 | | 630 | 25 |
| Ex. 7 | 60 | 87 | 25 | 28 | 22.9 | 77.1 | | 700 | 15 |
| Ex. 8 | 70 | 71 | 0 | 58 | 42.9 | 57.1 | | 720 | 15 |
| Ex. 9 | 70 | 71 | 5 | 25 | 35.4 | 64.6 | | 640 | 20 |
| Ex. 10 | 50 | 243 | 0 | 118 | 70.0 | 30.0 | | 640 | 15 |
| Ex. 11 | 60 | 87 | 0 | 58 | 53.3 | 46.7 | Pressureless sintering | 800 | — |
| Ex. 12 | 40 | 33 | 10 | 120 | 83.3 | 16.7 | | 700 | — |
| Ex. 13 | 30 | 111 | 25 | 28 | 80.0 | 20.0 | Hot isostatic pressing sintering | 650 | 25 |
| Ex. 14 | 70 | 71 | 0 | 20 | 42.9 | 57.1 | | 700 | 20 |
| C. Ex. 1 | 80 | 127 | 10 | 104 | 35.7 | 64.3 | Hot-pressing | 720 | 20 |
| C. Ex. 2 | 60 | 267 | 5 | 78 | 45.5 | 54.5 | | 700 | 20 |
| C. Ex. 3 | 40 | 33 | 30 | 25 | 20.0 | 80.0 | | 720 | 15 |
| C. Ex. 4 | 60 | 30 | 10 | 104 | 42.0 | 58.0 | | 680 | 20 |
| C. Ex. 5 | 30 | 111 | 0 | 58 | 93.3 | 6.7 | | 750 | 20 |
| C. Ex. 6 | 70 | 47 | 25 | 28 | 12.9 | 87.1 | | 720 | 20 |
| C. Ex. 7 | 35 | 243 | 0 | 20 | 90.0 | 10.0 | | 740 | 20 |
| C. Ex. 8 | 50 | 42 | 0 | 20 | 70.0 | 30.0 | | 820 | 17.5 |
| C. Ex. 9 | 40 | 172 | 20 | 82 | 75.0 | 25.0 | | 580 | 20 |
| C. Ex. 10 | 60 | 87 | 10 | 27 | 38.0 | 62.0 | | 860 | 25 |
| C. Ex. 11 | 50 | 122 | 5 | 78 | 53.3 | 46.7 | | 610 | 15 |
| C. Ex. 12 | 60 | 77 | 0 | 28 | 61.7 | 38.3 | | 680 | 20 |
| C. Ex. 13 | 50 | 82 | 5 | 25 | 77.8 | 22.2 | | 200 | 40 |
| C. Ex. 14 | 60 | 87 | 0 | 28 | 73.3 | 26.7 | | 150 | 60 |
| C. Ex. 15 | 50 | 42 | 0 | 20 | 60.0 | 40.0 | | 200 | 60 |
| C. Ex. 16 | 60 | 87 | 5 | 78 | 63.6 | 36.4 | | 200 | 60 |
| C. Ex. 17 | 70 | 71 | 0 | 20 | 42.9 | 57.1 | Pressureless sintering | 800 | — |

TABLE 1-continued

| | Raw material powder | | | | | | Sintering condition | | |
|---|---|---|---|---|---|---|---|---|---|
| | High-Ga-containing Cu—Ga powder | | Low-Ga-containing Cu—Ga powder | | Blending ratio of high and low Ga powders (%) | | | | |
| | Ga content (atomic %) | Average grain size (μm) | Ga content (atomic %) | Average grain size (μm) | High-Ga containing Cu—Ga powder | Low-Ga containing Cu—Ga powder | Sintering method | Temp. (° C.), 1 h | Pressure (MPa) |
| C. Ex. 18 | 50 | 82 | 5 | 25 | 77.8 | 22.2 | Hot isostatic pressing sintering | 200 | 60 |
| C. Ex. 19 | 60 | 77 | 0 | 28 | 61.7 | 38.3 | | 680 | 25 |
| C. Ex. 20 | | | | | Casting | | | | |

TABLE 2

| | Target characteristics | | | | | | | | |
|---|---|---|---|---|---|---|---|---|---|
| | Composition of metal element (atomic %) | | High-Ga phase Ga (atomic %) | Low-Ga phase Ga (atomic %) | Density | | Structure | Existence or non-existence of cracking in cutting | Bending strength (MPa) |
| | Ga | Cu and inevitable impurities | | | (g/cm$^3$) | (%) | | | |
| Ex. 1 | 29 | Balance | 29.8 | 25.8 | 8.53 | 99.8 | A | Non-existent | 385 |
| Ex. 2 | 30 | Balance | 32.1 | 21.8 | 8.39 | 98.1 | A | Non-existent | 347 |
| Ex. 3 | 35 | Balance | 33.7 | 24.0 | 8.11 | 96.2 | A | Non-existent | 226 |
| Ex. 4 | 30 | Balance | 30.6 | 22.1 | 8.50 | 99.4 | A | Non-existent | 374 |
| Ex. 5 | 33 | Balance | 35.1 | 21.5 | 8.23 | 96.3 | A | Non-existent | 296 |
| Ex. 6 | 32 | Balance | 34.6 | 22.0 | 7.89 | 92.3 | A | Non-existent | 278 |
| Ex. 7 | 33 | Balance | 30.2 | 25.7 | 8.27 | 96.7 | A | Non-existent | 309 |
| Ex. 8 | 30 | Balance | 32.8 | 20.6 | 8.41 | 98.4 | A | Non-existent | 317 |
| Ex. 9 | 28 | Balance | 34.2 | 19.8 | 7.87 | 92.0 | A | Non-existent | 278 |
| Ex. 10 | 35 | Balance | 32.7 | 20.9 | 7.78 | 92.3 | A | Non-existent | 224 |
| Ex. 11 | 32 | Balance | 33.1 | 22.5 | 8.34 | 97.5 | A | Non-existent | 275 |
| Ex. 12 | 35 | Balance | 36.6 | 25.4 | 7.63 | 90.5 | A | Non-existent | 216 |
| Ex. 13 | 29 | Balance | 30.2 | 22.6 | 8.34 | 97.5 | A | Non-existent | 323 |
| Ex. 14 | 30 | Balance | 31.3 | 23.5 | 8.48 | 99.2 | A | Non-existent | 340 |
| C. Ex. 1 | 35 | Balance | Could not evaluate due to occurrence of melting-out in pressurized-temperature elevation | | | | | | |
| C. Ex. 2 | 30 | Balance | Could not evaluate due to occurrence of melting-out in pressurized-temperature elevation | | | | | | |
| C. Ex. 3 | 32 | Balance | 33.6 | 30.2 | 8.34 | 97.5 | A | Existent | 188 |
| C. Ex. 4 | 31 | Balance | 44.2 | 19.2 | 7.42 | 86.8 | B | Non-existent | 152 |
| C. Ex. 5 | 28 | Balance | Single phase structure | | 8.52 | 99.6 | C | Existent | 169 |
| C. Ex. 6 | 30.8 | Balance | Single phase structure | | 8.48 | 99.2 | C | Existent | 154 |
| C. Ex. 7 | 31.5 | Balance | Single phase structure | | 8.46 | 98.9 | C | Existent | 144 |
| C. Ex. 8 | 35 | Balance | Could not evaluate due to occurrence of melting-out in temperature elevation | | | | | | |
| C. Ex. 9 | 35 | Balance | 35.6 | 18.6 | 7.22 | 85.6 | B | Non-existent | 124 |
| C. Ex. 10 | 29 | Balance | Could not evaluate due to occurrence of melting-out in temperature elevation | | | | | | |

TABLE 2-continued

| | Composition of metal element (atomic %) | | High-Ga phase Ga (atomic %) | Low-Ga phase Ga (atomic %) | Density | | | Existence or non-existence of cracking in cutting | Bending strength (MPa) |
|---|---|---|---|---|---|---|---|---|---|
| | Ga | Cu and inevitable impurities | | | (g/cm³) | (%) | Structure | | |
| C. Ex. 11 | 29 | Balance | 34.4 | 20.1 | 7.68 | 89.8 | B | Non-existent | 181 |
| C. Ex. 12 | 37 | Balance | 39.2 | 29.6 | 8.12 | — | A | Existent | 138 |
| C. Ex. 13 | 40 | Balance | Single phase structure | | 7.31 | — | C | Existent | 129 |
| C. Ex. 14 | 44 | Balance | 47.2 | 33.4 | 7.41 | — | A | Existent | 115 |
| C. Ex. 15 | 30 | Balance | 49.8 | 0 | 7.23 | 84.6 | B | Non-existent | 137 |
| C. Ex. 16 | 40 | Balance | 49.7 | 6 | 6.87 | — | B | Non-existent | 123 |
| C. Ex. 17 | 30 | Balance | Not functioning as Cu—Ga target due to proceeding of oxidation to the internal part of sintered material | | | | | | |
| C. Ex. 18 | 40 | Balance | Single phase structure | | 7.42 | — | C | Existent | 112 |
| C. Ex. 19 | 37 | Balance | 39.6 | 30.1 | 8.21 | — | A | Existent | 142 |
| C. Ex. 20 | 30 | Balance | Cast structure | | 8.55 | 100 | D | Existent | 211 |
| C. Ex. 21 | 35 | Balance | Cast structure | | 8.43 | 100 | D | Existent | 207 |

Based on the results shown above, it was demonstrated that the target structures had the coexistence microstructure in which the low-Ga alloy phase was surrounded by the high-Ga alloy phase ("A" in Table 2) and there was no cracking during cutting in any one of the Cu—Ga binary alloy sputtering targets of Examples 1-14. In addition, density of 90% or more and bending strength of 200 MPa or more was obtained in any one of the Cu—Ga binary alloy sputtering targets of Examples 1-14.

Contrary to that, in Comparative Examples 3, 12, 14, and 19 with a high Ga content of the low-Ga alloy phase, cracking occurred during cutting and bending strength was less than 200 MPa, even though they had the structure in which the low Ga phase was surrounded by the high-Ga phase (Structure "A"). In addition, in Comparative Examples 4, 9, 11, 15, and 16 with the structure in which the high Ga phase was surrounded by the low-Ga phase (Structure "B"), there was no cracking during cutting. However, density was low and bending strength was less than 200 MPa in the target of the Comparative Examples 4, 9, 11, 15, and 16. In addition, in Comparative Examples 5, 6, 7, 13, and 18 with the single phase (Structure "C"), there was cracking during cutting and bending strength was less than 200 MPa. Furthermore, in Comparative Examples 20 and 21, which were in the cast structure (Structure "D"), there was cracking during cutting although high bending strength was obtained. In Comparative Example 17, oxidation was proceeded to the internal part of the sintered material. As a result, Comparative Example 17 did not function as Cu—Ga binary alloy sputtering target.

In regard to the target structures of the Cu—Ga binary alloy sputtering targets, which were the specific examples of the present invention, the composition image (COMPO image), the Cu element mapping image; and the Ga element mapping image, of the specific example of the Cu—Ga binary alloy sputtering target of the present invention obtained by the electron probe micro analyzer (EPMA), model JXA-8500F, manufactured by JEOL Ltd. are shown in FIGS. 1 and 2. The original images of these element mapping images are colored-images. Images shown in FIGS. 1 and 2 are shown as gray-scaled images with black-white conversion. In these images, the spot with higher element content tends to be brighter.

The target of Example of the present invention had the composition including 30 atomic % of Ga and the Cu balance and inevitable impurities. The hot-pressing condition was: 740° C. of the holding temperature; 1 hour of the holding time; and 200 kgf/cm² (19.6 MPa) of pressure. The hot-pressing was performed in vacuum atmosphere.

The target of Example of the present invention had density of 8.5 g/cm³ and bending strength of 374 MPa.

Figure 3:
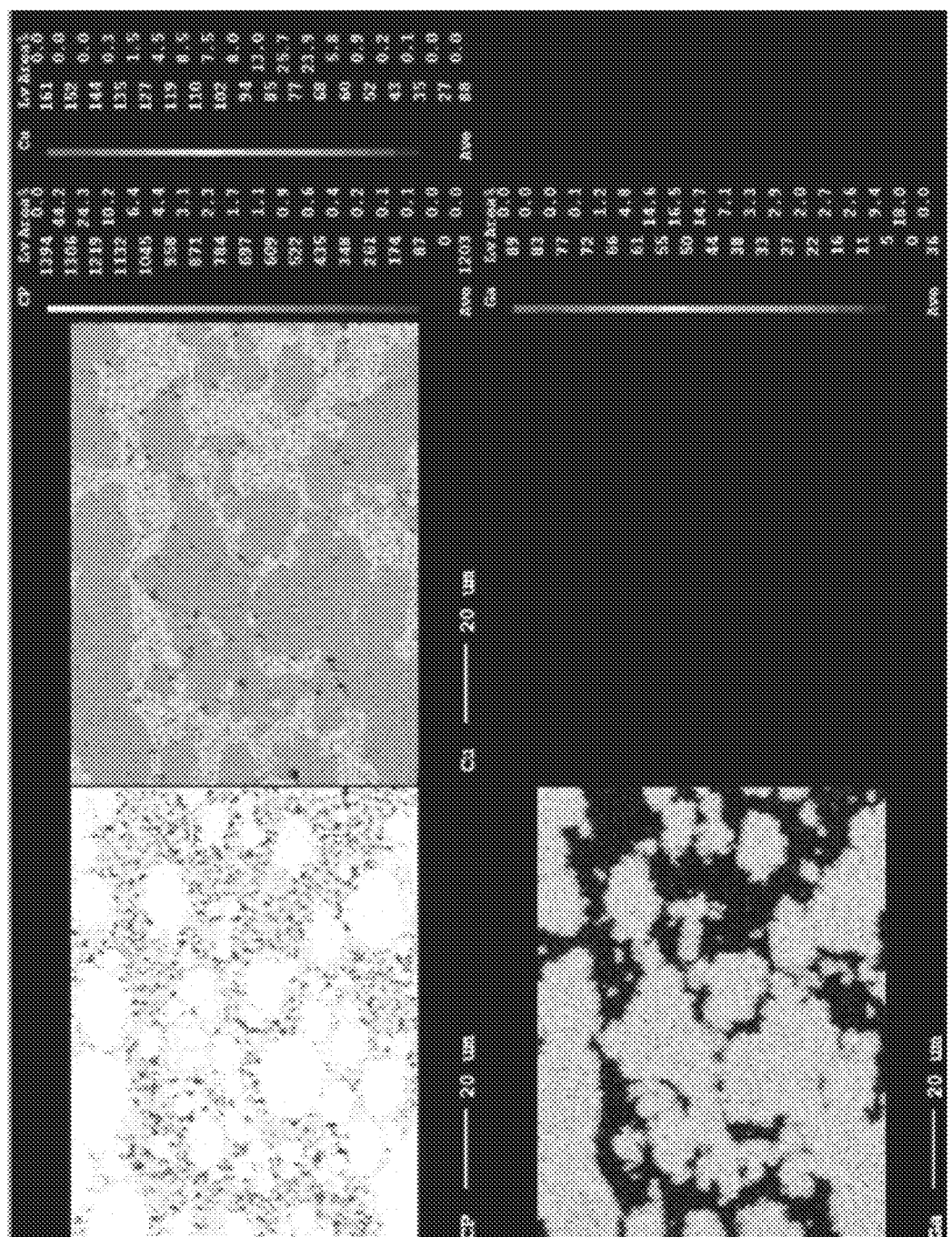
FIG. 3 is a photographic image showing a composition image (COMPO image); Cu element mapping image; and Ga element mapping image, of the Cu—Ga binary alloy sputtering target related to the conventional example obtained by an electron probe micro analyzer (EPMA).

As Comparative Example, the target with the composition including 30 atomic % of Ga and the Cu balance and inevitable impurities was subjected to hot-pressing. The hot-pressing condition was: 200° C. of the holding temperature; 1 hour of the holding time; and 600 kgf/cm² (about 60 MPa) of pressure. The hot-pressing was performed in vacuum atmosphere. This target of Comparative Example had density of 7.23 g/cm³ and bending strength of 137.0 MPa. In regard to the target structure of this Comparative Example, the composition image (COMPO image), the Cu element mapping image; and the Ga element mapping image obtained by EPMA is shown in FIG. 3.

Based on the results of the structure observation, it was demonstrated that the target of Example of the present invention had the coexistence microstructure in which the low-Ga-containing Cu—Ga binary alloy phase is surrounded by the high-Ga-containing Cu—Ga binary alloy phase.

Contrary to that, it was demonstrated that the target of Comparative Example had other coexistence microstructure in which the high-Ga-containing Cu—Ga binary alloy phase is surrounded by the low-Ga-containing Cu—Ga binary alloy phase.

Second Embodiment

As explained above, the sputtering target has the coexistence microstructure, in which the low-Ga-containing Cu—Ga binary alloy phase is surrounded by the high-Ga-containing Cu—Ga binary alloy phase, in the Cu—Ga binary alloy sputtering target of the first embodiment of the present invention. In the Cu—Ga binary alloy sputtering target of the second embodiment of the present invention, Na or Na compound is added to the Cu—Ga binary alloy sputtering target of the first embodiment with the coexistence microstructure.

Example (Ex.)

As raw material powders used for examples of the present invention, the high-Ga-containing Cu—Ga binary alloy powder and low-Ga-containing Cu—Ga binary alloy powder prepared as in the first embodiment of the present invention can be used. The high-Ga-containing Cu—Ga binary alloy powder and low-Ga-containing Cu—Ga binary alloy powder having the compositions and the average sizes shown in Table 3 below were prepared. The Ga contents are shown in the column of "Ga amount (atomic %)" in the "Raw material powder" column in Table 3. In the case where the pure copper powder was used instead of the low-Ga-containing Cu—Ga binary alloy powder, "0" is shown in "Ga (atomic %)" column of "Low-Ga-containing Cu—Ga powder" in Table 3.

Next, mixed powders (Examples 15-20) were prepared by: weighting the high-Ga-containing Cu—Ga binary alloy powder and low-Ga-containing Cu—Ga binary alloy powder or the pure copper powder in the blending ratios shown in the column "Blending ratio of high-Ga powder and low-Ga powder (%)" in Table 3; weighting the sodium (Na) compound powder in order to obtain the added amount of Na shown in the column "Na added amount (%)" in Table 3; blending the weighted powders; and mixing the blended powders as in the first embodiment of the present invention. In addition, mixed powders (Examples 21-23) were prepared by: weighting the high-Ga-containing Cu—Ga binary alloy powder and low-Ga-containing Cu—Ga binary alloy powder or the pure copper powder in the blending ratios shown in the column "Blending ratio of high-Ga powder and low-Ga powder (%)" in Table 3; weighting the Na-containing Cu powder made of the Na compound and copper (Cu) in order to obtain the added amount of Na shown in the column "Na added amount (%)" in Table 3; blending the weighted powders; and mixing the blended powders. As the above-mentioned Na compound powder, at least one selected from the group consisting of the sodium fluoride (NaF) powder, the sodium sulfide (NaS) powder, and the sodium selenide ($Na_2Se$) powder was selected. Purity of the Na compound was 2N (99%). Sintering of Examples 15 and 16 was performed in: 100% $H_2$ atmosphere; and 97% $N_2$ and 3% $H_2$ atmosphere, respectively.

By using the mixed powders of Examples 15-23 prepared as described above, sintering by vacuum hot-pressing method; pressureless sintering; or hot isostatic pressing sintering, was performed in accordance with the conditions shown in the column "Sintering condition" in Table 3. The surface parts and the outer peripheral parts of the obtained sputtering targets were subjected to lathing to produce the Cu—Ga binary alloy sputtering targets of Examples 15-23 with 50 mm of diameter and 6 mm of thickness. In production of the Cu—Ga binary alloy sputtering targets of Examples 16, 17, 20, and 22, pure copper powder was used instead of the low-Ga-containing Cu—Ga binary alloy powder. Thus, "0" is shown in "Ga (atomic %)" column of "Low-Ga-containing Cu—Ga powder" in Table 3.

In regard to the Cu—Ga binary alloy sputtering targets of Examples 15-23, the Ga content (atomic %) to the whole target, the Ga content (atomic %) in the high-Ga-containing Cu—Ga binary alloy powder, and the Ga content (atomic %) in the low-Ga-containing Cu—Ga binary alloy powder, are shown in the column "Composition of metal element (atomic %)" in Table 4, in the column "High-Ga phase" in Table 4, and in the column "Low-Ga phase" in Table 4, respectively.

In addition, in regard to the Cu—Ga binary alloy sputtering targets of Examples 15-23, Calculated results of density of the Cu—Ga binary alloy sputtering targets of Examples 15-23, are shown in the column "Density" in Table 4. The calculation method of density is as in the first embodiment of the present invention.

In addition, measurement of the average grain size of the Na compound; observing the structure by EPMA; monitoring existence or non-existence of fracturing; measuring bending strength; and measuring of the number of unusual discharge, were performed in the Cu—Ga binary alloy sputtering target of Examples 15-23 as in the first embodiment of the present invention. These results are shown in the column "Average grain size of Na compound (μm)"; the column "Structure"; the column "Existence or non-existence of cracking in cutting"; the column "Bending strength (MPa)"; and the column "Number of unusual discharge (times/h)", respectively, in Table 4.

In the measurement of the average grain size of the Na compound, the average grain size was calculated by: taking 10 images of 500-times magnified COMPO images (60 μm×80 μm) in the obtained sintered materials of Examples 15-23 by EPMA; and measuring the grain sizes of the Na compounds on these 10 images.

In the measurement of the number of unusual discharge, the obtained sintered materials of Examples 15-23 were machined into the dimension of 152.4 mm of diameter and 6 mm of thickness to produce sputtering targets. On each of the sputtering targets, evaluation of unusual discharge during sputtering was performed by using the magnetron sputtering system. Electrical power density was 5 W/cm² in DC. Flow rate of Ar during sputtering was 50 sccm. Pressure was 0.67 Pa. The number of unusual discharge during continuous sputtering for 1 hour (h) was recorded by the arching counter attached to the sputter power supply (model RGB-50 manufacture by mks Co.).

Comparative Example (C. Ex.)

As Comparative Examples, the Cu—Ga binary alloy sputtering targets of Comparative Examples 22-24, in which the Ga content or the average grain size of the high-Ga-containing binary alloy phase or the low-Ga-containing binary alloy phase was set to be out of the ranges configured in the present invention as shown in Table 3, were produced. Also, the Cu—Ga binary alloy sputtering target of Comparative Example 25, in which pressureless sintering was performed in a condition configured differently from the condition in the present invention was produced. In producing of the Cu—Ga binary alloy sputtering targets of Comparative Examples 22-24, pure copper powder was used instead of the low-Ga-containing Cu—Ga binary alloy powder. Thus, "0" is shown in "Ga (atomic %)" column of "Low-Ga-containing Cu—Ga powder" in Table 3.

The evaluation results of the Cu—Ga binary alloy sputtering targets of Comparative Examples 22-25 are shown in Table 4. In Comparative Example 22, melting-out occurred during pressurized-elevation of temperature. Thus, the above-explained evaluation was not performed. In Comparative Example 25, oxidation was proceeded to the internal part of the sintered material. As a result, Comparative Example 25 did not function as Cu—Ga binary alloy sputtering target. Thus, the above-explained evaluation was not performed.

TABLE 3

| | Raw material powder | | | | | | | | | | | | |
|---|---|---|---|---|---|---|---|---|---|---|---|---|---|
| | High-Ga-containing Cu—Ga powder | | Low-Ga-containing Cu—Ga powder | | Na-containing | | | Blending ratio of high and low Ga powders | | Na added amount (%) | | Sintering condition | | |
| | Ga content (atomic %) | Average grain size (μm) | Ga content (atomic %) | Average grain size (μm) | compound powder Na compound | Na compound | Cu powder Na amount (atomic %) | High-Ga containing Cu—Ga powder | Low-Ga containing Cu—Ga powder | Na compound powder | Na-containing Cu powder | Sintering method | Temp. (° C.), 1 h | Pressure (MPa) |
| Ex. 15 | 50 | 25 | 20 | 13 | NaF | — | — | 30.0 | 70.0 | 1.5 | — | Hot-pressing | 720 | 17.5 |
| Ex. 16 | 60 | 192 | 0 | 22 | NaS | — | — | 46.7 | 53.3 | 0.5 | — | | 760 | 20 |
| Ex. 17 | 40 | 74 | 0 | 26 | NaS | — | — | 71.2 | 28.8 | 10.0 | — | | 740 | 10 |
| Ex. 18 | 40 | 102 | 10 | 47 | NaF | — | — | 83.3 | 16.7 | 2.0 | — | | 620 | 10 |
| Ex. 19 | 60 | 31 | 20 | 89 | Na₂Se | — | — | 32.5 | 67.5 | 15.0 | — | | 700 | 15 |
| Ex. 20 | 60 | 23 | 0 | 52 | NaS | — | — | 50.0 | 50.0 | 1.0 | — | Pressureless sintering | 800 | — |
| Ex. 21 | 60 | 45 | 20 | 36 | — | NaF | 10 | 27.5 | 72.5 | — | 3.0 | | 790 | — |
| Ex. 22 | 40 | 83 | 0 | 83 | — | Na₂Se | 15 | 72.5 | 27.5 | — | 10.0 | | 810 | — |
| Ex. 23 | 50 | 23 | 5 | 77 | — | NaF | 8 | 55.6 | 44.4 | — | 15.0 | Hot isostatic pressing sintering | 700 | 30 |
| C. Ex. 22 | 60 | 267 | 0 | 32 | NaF | — | — | 53.3 | 46.7 | 1.0 | — | Hot-pressing | 700 | 20 |
| C. Ex. 23 | 60 | 42 | 0 | 104 | NaS | — | — | 50.0 | 50.0 | 3.0 | — | | 660 | 15 |
| C. Ex. 24 | 60 | 26 | 0 | 121 | NaF | — | — | 50.0 | 50.0 | 3.0 | — | | 700 | 25 |
| C. Ex. 25 | 40 | 21 | 10 | 26 | — | NaF | — | 60.0 | 40.0 | — | 10.0 | Pressureless sintering | 700 | 40 |

TABLE 4

| | Composition of metal element (atomic %) | | | High-Ga phase Ga | Low-Ga phase Ga | Average grain size of Na compound | Density | | | Existence or non-existence of cracking in | Bending strength | Sputter characteristics Number of unusual discharge |
|---|---|---|---|---|---|---|---|---|---|---|---|---|
| | Ga | Na | Cu and inevitable impurities | (atomic %) | (atomic %) | (μm) | (g/cm³) | (%) | Structure | cutting | (MPa) | (times/h) |
| Ex. 15 | 29 | 0.5 | Balance | 31.2 | 24.3 | 2.5 | 8.33 | 97.4 | A | Non-existent | 314 | 0 |
| Ex. 16 | 28 | 0.5 | Balance | 30.2 | 22.3 | 5.7 | 8.47 | 99.1 | A | Non-existent | 374 | 2 |
| Ex. 17 | 28.5 | 10 | Balance | 29.9 | 21.7 | 4.3 | 8.34 | 97.5 | A | Non-existent | 320 | 1 |
| Ex. 18 | 35 | 2 | Balance | 30.3 | 23.7 | 7.9 | 7.98 | 94.7 | A | Non-existent | 223 | 17 |
| Ex. 19 | 33 | 15 | Balance | 32.5 | 20.6 | 8.1 | 8.02 | 95.1 | A | Non-existent | 274 | 31 |
| Ex. 20 | 30 | 1 | Balance | 33.2 | 22.1 | 3.5 | 8.33 | 97.4 | A | Non-existent | 309 | 1 |
| Ex. 21 | 31 | 3 | Balance | 33.9 | 24.6 | 5.2 | 8.21 | 96.0 | A | Non-existent | 299 | 46 |
| Ex. 22 | 29 | 10 | Balance | 31.1 | 23.4 | 6.7 | 8.19 | 95.8 | A | Non-existent | 343 | 65 |
| Ex. 23 | 30 | 15 | Balance | 31.6 | 22.8 | 9.1 | 8.50 | 99.4 | A | Non-existent | 346 | 94 |
| C. Ex. 22 | 32 | 1 | Balance | Could not evaluate due to occurrence of melting-out in pressurized-temperature elevation | | | | | | | | |
| C. Ex. 23 | 30 | 3 | Balance | 33.7 | 20.2 | 12 | 7.35 | 86.0 | B | Non-existent | 176 | 256 |
| C. Ex. 24 | 30 | 3 | Balance | 34.1 | 20.3 | 15 | 8.23 | 96.3 | B | Non-existent | 189 | 301 |
| C. Ex. 25 | 28 | 10 | Balance | Not functioning as Cu—Ga target due to proceeding of oxidation to the internal part of sintered material | | | | | | | | |

Based on the results shown above, it was demonstrated that the target structures had the coexistence microstructure in which the low-Ga alloy phase was surrounded by the high-Ga alloy phase ("A" in Table 4) and there was no cracking during cutting in any one of the Cu—Ga binary alloy sputtering targets of Examples 15-23 even though Na was added to the targets. In addition, density of 90% or more; bending strength of 200 MPa or more was obtained; and the number of unusual discharge was reduced in any one of the Cu—Ga binary alloy sputtering targets of Examples 22-25.

Contrary to that, in Comparative Example 22, melting-out of Ga occurred during temperature elevation due to too large average grain size of the high-Ga alloy powder in the high-Cu phase. Thus, the desired target characteristics were not obtained. In Comparative Examples 23 and 24, the targets had the structure in which the high Ga phase was surrounded by the low-Ga phase (Structure "B"). There was no cracking during cutting. However, density was low and bending strength was less than 200 MPa in the target of the Comparative Examples 23 and 24. Moreover, unusual discharge during sputtering occurred at a high level because of too large average grain size of the Na compound. In addition, in Comparative Example 25, oxidation was proceeded to the internal part of the sintered material. As a result, Comparative Example 25 did not function as Cu—Ga binary alloy sputtering target.

When the present invention is utilized as a sputtering target, it is preferable that the surface roughness Ra of the sputtering target is set to 1.5 μm or less; the electrical resistance is set to $10^{-4}$ Ω·cm or less; and the concentration of metallic impurities is set to 0.1 atomic % or less. Any one of the above-described Examples satisfies these conditions.

The present invention is not limited by the description of the above-explained embodiments, and can be subjected to a variety of modification without departing from the scope of the present invention.

INDUSTRIAL APPLICABILITY

The Cu—Ga binary alloy sputtering target, which has excellent mechanical workability, high density, and high bending strength, can be applied to a more efficient solar cell production.

The invention claimed is:

1. A Cu—Ga binary alloy sintered body sputtering target with a composition including 28 to 35 atomic % of Ga and the Cu balance and inevitable impurities, wherein
   the sputtering target has a coexistence microstructure in which a low-Ga-containing Cu—Ga binary alloy phase is surrounded by a high-Ga-containing Cu—Ga binary alloy phase,
   the low-Ga-containing Cu—Ga binary alloy phase includes 26 atomic % or less of Ga and a Cu balance,
   the high-Ga-containing Cu—Ga binary alloy phase includes 28 atomic % or more of Ga, and
   the low-Ga-containing Cu—Ga binary alloy phase is dispersed in a matrix of the high-Ga-containing Cu—Ga binary alloy phase.

2. The Cu—Ga binary alloy sintered body sputtering target according to claim 1, wherein the Cu—Ga binary alloy has a composition including: 28 to 35 atomic % of Ga; 0.05 to 15 atomic % of Na; and the Cu balance and inevitable impurities, as metal element composition.

3. The Cu—Ga binary alloy sintered body sputtering target according to claim 2, wherein the Na is included as a form of at least a Na-compound selected from a group consisting of sodium fluoride, sodium sulfide, and sodium selenide.

4. The Cu—Ga binary alloy sintered body sputtering target according to claim 3, wherein the Cu—Ga binary alloy sputtering target has a structure in which the Na-compound is dispersed in a matrix of the Cu—Ga binary alloy sputtering target; and an average grain size of the Na-compound is 10 μm or less.

5. A method of producing the Cu—Ga binary alloy sintered body sputtering target according to claim 1, the method comprising the steps of:
   preparing a mixed powder by: blending a pure copper powder or a low-Ga-containing Cu—Ga binary alloy powder, which includes 26 atomic % or less of Ga and a balance made of Cu with a high-Ga-containing Cu—Ga binary alloy powder, which includes Ga at higher than 28 atomic % and 75 atomic % or less and a balance made of Cu in such a way that a composition after blending includes 28 to 35 atomic % of Ga and a balance made of Cu; and mixing the powders after blending;

sintering the mixed powder by hot-pressing, hot isostatic pressing sintering, or pressureless sintering under a non-oxidizing atmosphere or a reducing atmosphere; and cutting a surface of a sintered material which is obtained in the step of sintering and has a composition including 28 to 35 atomic % of Ga and a balance made of Cu, wherein the high-Ga-containing Cu—Ga binary alloy powder is blended in the mixed powder at 15% or more and 85% or less, an average grain size of the high-Ga-containing Cu—Ga binary alloy powder is 250 μm or less and an average grain size of the pure copper powder or the low-Ga-containing Cu—Ga binary alloy powder is 125 μm or less, the average grain size of the high-Ga-containing Cu—Ga binary alloy powder is larger than the average grain size of the pure copper powder or the low-Ga-containing Cu—Ga binary alloy powder, and a holding temperature during the step of sintering is set to a temperature between a temperature 200° C. lower than a melting point of the mixed powder and a temperature 50° C. lower than the melting point of the mixed powder.

6. The method of producing the Cu—Ga binary alloy sintered body sputtering target according to claim 5 wherein the high-Ga-containing Cu—Ga binary alloy powder includes 45 atomic % of Ga or higher.

* * * * *